United States Patent
Goller et al.

(10) Patent No.: US 7,795,105 B2
(45) Date of Patent: Sep. 14, 2010

(54) METHOD FOR PRODUCING AN INTEGRATED CIRCUIT ASSEMBLY WITH AN AUXILIARY INDENTATION, PARTICULARLY WITH ALIGNING MARKS, AND AN INTEGRATED CIRCUIT ARRANGEMENT

(75) Inventors: Klaus Goller, Regensburg (DE); Olaf Heitzsch, Coswig (DE); Marion Nichterwitz, Dresden (DE)

(73) Assignee: Infineon Technologies AG, Munich (DE)

( * ) Notice: Subject to any disclaimer, the term of this patent is extended or adjusted under 35 U.S.C. 154(b) by 129 days.

(21) Appl. No.: 11/527,736

(22) Filed: Sep. 25, 2006

(65) Prior Publication Data

US 2007/0102819 A1   May 10, 2007

Related U.S. Application Data

(63) Continuation-in-part of application No. PCT/EP2005/051362, filed on Mar. 23, 2005.

(30) Foreign Application Priority Data

Mar. 25, 2004   (DE) .................. 10 2004 014 676

(51) Int. Cl.
*H01L 21/76* (2006.01)
(52) U.S. Cl. ...................... 438/401; 257/522
(58) Field of Classification Search ................ 438/401, 438/622
See application file for complete search history.

(56) References Cited

U.S. PATENT DOCUMENTS

| | | | |
|---|---|---|---|
| 5,786,260 A | 7/1998 | Jang et al. | |
| 5,863,825 A | 1/1999 | Pasch et al. | |
| 5,969,428 A * | 10/1999 | Nomura et al. | 257/797 |
| 6,133,111 A | 10/2000 | Sur et al. | |
| 6,153,492 A | 11/2000 | Wege et al. | |
| 6,215,197 B1 | 4/2001 | Iwamatsu | |
| 6,329,265 B1 * | 12/2001 | Miyawaki et al. | 438/401 |
| 6,369,456 B1 * | 4/2002 | Ando | 257/797 |
| 6,376,924 B1 | 4/2002 | Tomita et al. | |
| 6,555,925 B1 | 4/2003 | Higashi et al. | |
| 6,635,567 B2 | 10/2003 | Ebertseder et al. | |
| 6,764,954 B2 | 7/2004 | Diewald et al. | |
| 6,916,743 B2 * | 7/2005 | Yamashita et al. | 438/694 |
| 2001/0006246 A1 * | 7/2001 | Kwag et al. | 257/522 |
| 2001/0045651 A1 | 11/2001 | Saito et al. | |
| 2002/0098676 A1 * | 7/2002 | Ning et al. | 438/622 |
| 2002/0098707 A1 | 7/2002 | Ning | |
| 2004/0038543 A1 | 2/2004 | Zahorik et al. | |
| 2004/0043579 A1 | 3/2004 | Nuetzel et al. | |
| 2004/0192052 A1 * | 9/2004 | Mukherjee et al. | 438/697 |

(Continued)

FOREIGN PATENT DOCUMENTS

DE   199 03 196 A1   8/2000

(Continued)

*Primary Examiner*—Thanh V Pham
*Assistant Examiner*—Caleb Henry
(74) *Attorney, Agent, or Firm*—Brinks Hofer Gilson & Lione

(57) ABSTRACT

A method is disclosed for producing an integrated circuit arrangement with an auxiliary indentation, particularly with aligning marks, and an integrated circuit arrangement. The invention also relates to a method for producing aligning marks. During the method, a planarization is carried out before material is removed from an auxiliary indentation.

27 Claims, 3 Drawing Sheets

U.S. PATENT DOCUMENTS

2004/0262660 A1 * 12/2004 Huang .................. 257/301

FOREIGN PATENT DOCUMENTS

| DE | 100 25 209 A1 | 4/2001 |
| DE | 100 00 759 C1 | 5/2001 |
| DE | 100 37 446 A1 | 2/2002 |
| JP | 09223656 | 8/1997 |

* cited by examiner

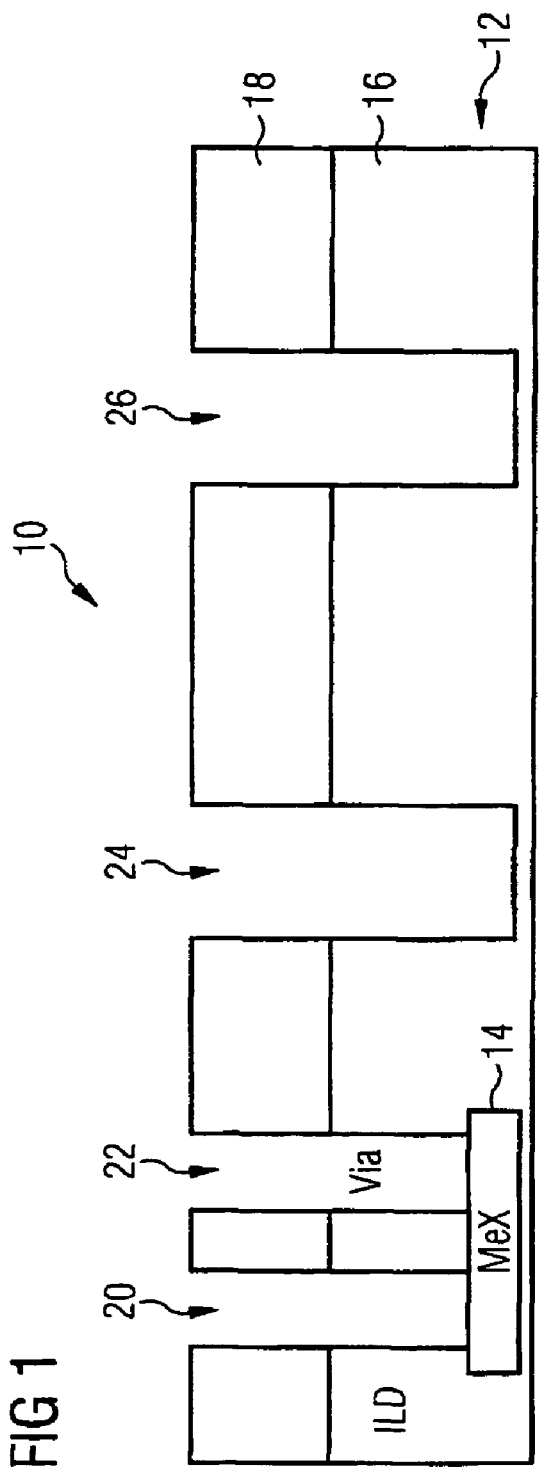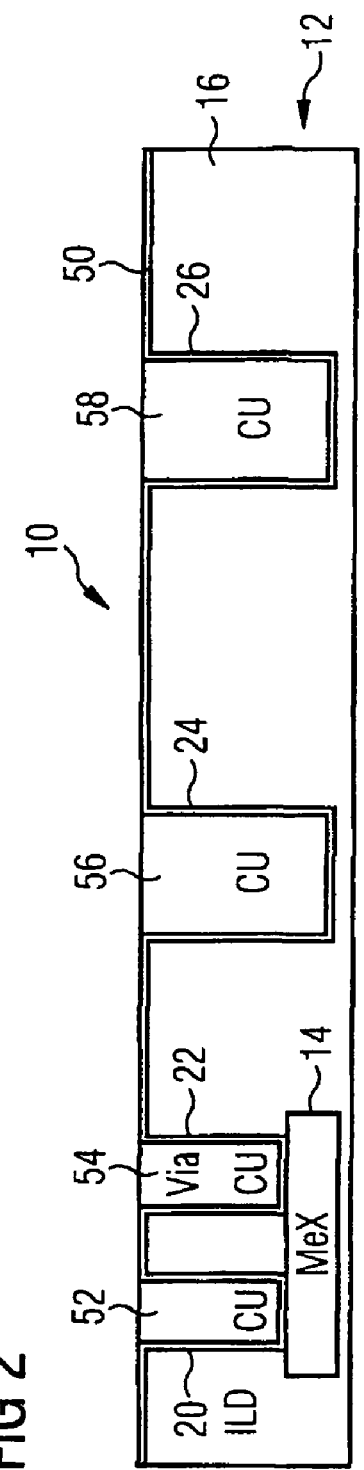

METHOD FOR PRODUCING AN INTEGRATED CIRCUIT ASSEMBLY WITH AN AUXILIARY INDENTATION, PARTICULARLY WITH ALIGNING MARKS, AND AN INTEGRATED CIRCUIT ARRANGEMENT

PRIORITY CLAIM

This application is a continuation-in-part of International Patent Application No. PCT/EP2005/051362, filed Mar. 23, 2005, and claims the benefit of priority of German Patent Application No. DE 10 2004014676.4, filed Mar. 25, 2004, which the contents of both are hereby incorporated by reference in their entirety herein.

BACKGROUND

1. Technical Field

The invention relates to a method for producing an integrated circuit arrangement. In particular, the invention relates to a method for producing an integrated circuit arrangement with at least one auxiliary indentation.

2. Background Information

An alignment mark may serve for the alignment of a mask with respect to the integrated circuit arrangement. This is called an alignment. The form of the alignment marks depends on the manufacturer of the irradiation apparatus used for irradiation, for example the manufacturer of an exposure apparatus. Alignment marks contain, for example, a plurality of strips of identical or different lengths that are arranged parallel to one another. To simultaneously perform an alignment in an x direction and in a y direction at right angles with respect thereto, an alignment mark contains angled strips, by way of example. As an alternative, marks are produced separately for each alignment direction.

The alignment mark may also serve to monitor the position of a developed resist on the integrated circuit arrangement. This is called an overlay mark. By way of example, the overlay mark has the form of a rectangle or frame. When inspecting the position of the exposed resist, for example a photoresist, use is made of a so-called box-in-box method, for example, which involves determining either the offset of a rectangular overlay mark with respect to a frame structure in a layer situated deeper or the offset of a frame-type overlay mark with respect to a rectangular structure in a deeper layer. If the offset exceeds a predetermined tolerance value in one direction, then the already developed resist is not used for an etching operation. The developed resist is removed and, after the application of a resist, the exposure and development are repeated.

In connection with a planarization during the production of the integrated circuit arrangement, a planar area arises, so that topology-containing alignment marks are absent. If, moreover, an optically impermeable or only inadequately permeable layer is applied to the planar area after planarization, then alignment marks already fabricated in an earlier method step can no longer be used either.

BRIEF SUMMARY

It is an object of the disclosure to specify a simple method for producing an integrated circuit arrangement, the method being intended to enable, in particular, small alignment tolerances between elements of different layers of the integrated circuit arrangement.

The disclosure is based on the consideration that the alignment errors are particularly small when, despite the planarization and subsequent deposition of an optically impermeable layer, it is possible to use alignment marks whose position had already been defined prior to the planarization. This is because an alignment error is associated with each mask. If the alignment is effected directly with respect to the preliminary plane, then said alignment error is incorporated only once into the resulting overall error ($\Delta f$). If, in contrast, it is necessary to introduce an additional mask between two mutually adjacent planes, then this results in an error of $1.41 \times \Delta f$.

Therefore, the following steps are performed in the method: producing at least one useful indentation and at least one auxiliary indentation in a substrate, applying a filling layer to the substrate provided with the useful indentation and with the auxiliary indentation, with filling material being introduced into the useful indentation and into the auxiliary indentation; planarization of the filling material, the filling material remaining in the useful indentation and the filling material remaining in the auxiliary indentation; and selective removal of at least a portion of the filling material in the auxiliary indentation after planarization, with no filling material being removed from the useful indentation.

The auxiliary indentation, despite the planarization, can be used as a starting point for a topology formation after the deposition of a layer, in particular an optically impermeable layer. In addition, the planarization is performed prior to the selective removal. This results in a surface with a small topology in the event of planarization. Moreover, abraded material or other contaminants are prevented from passing into the useful indentation during planarization. Such contaminants would be difficult to remove and, upon remaining in the auxiliary indentation would impair the function thereof as an alignment mark. A resist serving for selective removal e.g. a photoresist, likewise does not impede the planarization.

The auxiliary indentation or a topology arising on the auxiliary indentation may be used as an alignment mark during the patterning of a layer, which is applied after the selective removal.

The planarization may be carried out in chemical mechanical process, with a polishing pad and a polishing liquid being used. The chemical mechanical polishing (CMP) is employed particularly in the case of filling materials comprising copper or a copper alloy. As an alternative, a dielectric filling material, in particular an oxide, may be used as filling material, in particular in the case of indentations in a semiconductor substrate, for example in a silicon substrate.

A covering layer may be applied after the selective removal, a portion of the covering layer being deposited in the auxiliary indentation, but not in the useful indentation. If the covering layer contains metal or contains silicon, then it is impermeable to light or permeable to light only in a very narrow frequency range.

The covering layer may be patterned by a photolithographic method, the topology produced as a result of the auxiliary indentation in the covering layer being used as an alignment mark. This method step is suitable in particular when a copper metal layer or a copper via filling is followed by application of an aluminum layer, for example a topmost aluminum layer, on which better bonding can be effected in comparison with copper.

The selective removal may be carried out by application of a resist layer, irradiation of the resist layer and the development of the resist layer and also subsequent dry-chemical or wet-chemical etching. After the development of the resist layer, only the auxiliary indentation, but not the useful indentation, is uncovered. The alignment for the irradiation of the resist layer or for monitoring the position of the developed resist layer can be carried out by optical methods, because the resist layer is transmissive for a relatively large light range.

However, in one arrangement, the alignment tolerances are at least a factor of 3 higher in comparison with at least one other alignment during the production of the integrated circuit arrangement because only regions in which auxiliary indentations are situated and in which useful indentations are situated are intended to be differentiated. Useful indentations are covered over a large area. Auxiliary indentations remain open over a large area.

The filling material may be removed from the auxiliary indentation wet-chemically, preferably using dilute sulfuric acid peroxide (DSP) mixture or by a DSP chemical (dilute sulfuric acid peroxide mixture with hydrofluoric acid HF in the ppm range). The etching chemicals mentioned are suitable at room temperature or higher temperatures for the selective removal of copper or a copper alloy with respect to a liner made of tantalum nitride.

The filling material may be completely removed from the auxiliary indentation. The topology differences brought about by the auxiliary indentation are as large as possible.

The substrate may comprise a semiconductor substrate in which the useful indentation and the auxiliary indentation are arranged. The useful indentation and also the auxiliary indentation are isolation trenches, for example, which serve for electrically isolating components of the integrated circuit arrangement. As an alternative, the substrate contains a semiconductor substrate and a dielectric layer, the useful indentation and the auxiliary indentation being arranged in the dielectric layer. The dielectric layer is arranged between two metal layers for example.

An integrated circuit arrangement is also disclosed having a wiring indentation and an auxiliary indentation in a dielectric layer. The wiring indentation contains a metal through which current flows during operation of the circuit arrangement, for example copper or a copper alloy having at least 50 atomic percent copper or tungsten. The auxiliary indentation may likewise contain a metal but one through which an electric current does not flow during operation of the circuit arrangement. The auxiliary indentation only serves as an alignment mark during the production of the integrated circuit arrangement. In one configuration, the auxiliary indentation contains aluminum or an aluminum alloy having at least 50 atomic percent of aluminum.

BRIEF DESCRIPTION OF THE DRAWINGS

Exemplary embodiments of the invention are explained below with reference to the accompanying drawings in which:

FIG. 1 is an example first production stage in the production of an integrated circuit arrangement.

FIG. 2 is an example second production stage in the production of an integrated circuit arrangement.

DETAILED DESCRIPTION

Figure 3:
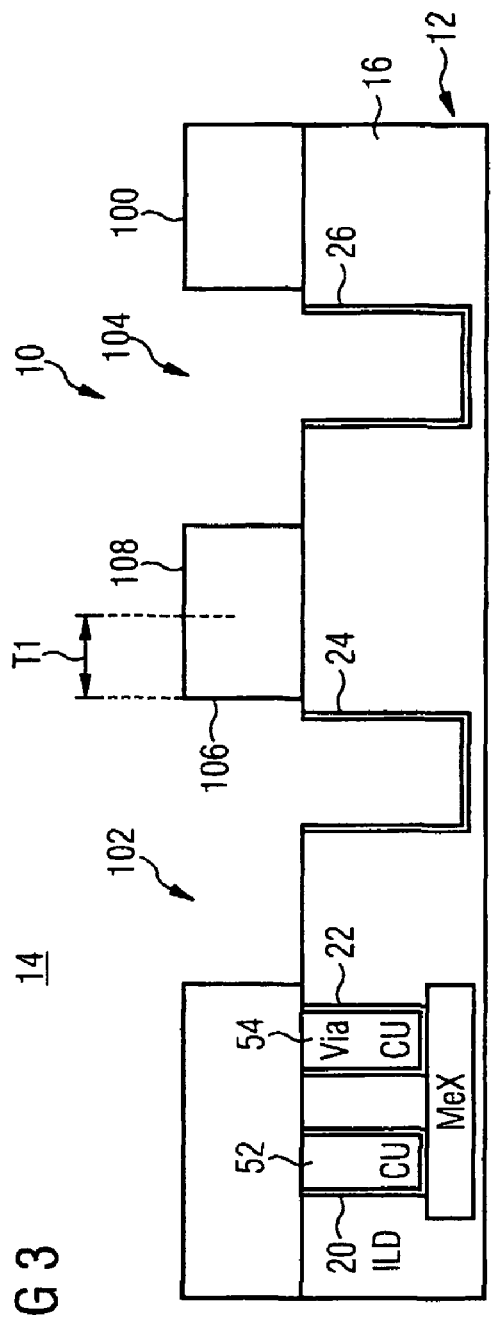
FIG. 3 is an example third production stage in the production of an integrated circuit arrangement.

FIG. 1 is an example first production stage in a production of an integrated circuit arrangement. An integrated circuit arrangement contains a semiconductor substrate (not illustrated in FIG. 1), for example a monocrystalline silicon substrate, in which a multiplicity of electronic components are formed, such as transistors. A metal layer 12 contains interconnects made of metal, for example an interconnect 14. The interconnects 14 of the metal layer 12 are arranged in one plane.

By way of example, the interconnect 14 comprises copper or a copper alloy having more than 90 atomic percent of copper. As an alternative, the interconnects 14 of the metal layer 12 comprise aluminum or an aluminum alloy having more than 90 percent of aluminum.

After the patterning of the metal layer 12, for example in a dry-chemical etching process or with the aid of a polishing operation, an insulating layer 16 was applied, which is also referred to as an interlayer dielectric (ILD). The insulating layer 16 contains silicon dioxide, for example, and has a thickness of 500 nm, for example, in particular greater than 300 nm.

After the production of the insulating layer 16, a resist layer 18 was applied to the insulating layer 16, 30 irradiated and developed, cutouts 20, 22, 24 and 26 having been produced. Alignment marks situated beneath the insulating layer 16 or in the metal layer 12 were used for aligning a photo mask used during the irradiation of the resist layer 18 and for monitoring the position 35 of the developed resist. The alignment and the monitoring are noncritical because the insulating layer 16 is optically transmissive. In a subsequent etching process, for example in a dry chemical etching process, the cutouts 20, 22, 24 and 26 were deepened into the insulating layer 16. The cutouts 20 and 22 in the insulating layer 16 serve, for example, to take up so-called vias and have a diameter of 200 nm, for example, in particular less than 500 nm. In contrast, cutouts 24 and 26 produced in the insulating layer 16 or the height differences brought about by the cutouts 24 and 26 serve as alignment marks. By way of example, the cutout 24 has a rectangular cross section having a length of greater than 10 μm and a width of greater than 3 μm. In the exemplary embodiment, the cutout 24 has a length of 20 μm and a width of 5 μm.

The cutout 26 has the same dimensions as the cutout 24. The cutouts 20 and 22 end on the interconnect 14. The metal layer 12 may be used as a stop layer for the cutouts 24 and 26 as well. It is thereby possible to set a defined depth of the auxiliary indentations. The bottom of the cutouts 24 and 26 is situated approximately at the level of the interconnect 14 in the insulating layer 16. The depth of the cutouts 24 and 26 is 600 nm, for example, but is also deeper in the absence of metallization layer 12.

As is further illustrated in FIG. 2, the residues of the resist layer 18 are removed after the dry etching of the insulating layer 16. A liner layer 50 is subsequently applied by sputtering, said liner layer comprising tantalum nitride and having a thickness of 70 nm, by way of example. The liner layer 50 is deposited outside the cutouts 20, 22, 24 and 26, on the side walls of the cutouts 20 to 26 and on the bottoms of the cutouts 20, 22, 24 and 26. Copper is subsequently deposited, for example, with the aid of a galvanic method. In this case, copper is deposited both outside the cutouts 20, 22, 24 and 26 and within the cutouts 20, 22, 24 and 26. In the exemplary embodiment, the cutouts 20, 22, 24 and 26 have been completely filled after the deposition of the copper. With the aid of a subsequent chemical mechanical polishing, the copper is removed from the liner layer 50 outside the cutouts 20, 22, 24 and 26. By way of example, the liner layer 50 serves as a stop layer during the chemical mechanical polishing. The stop layer is likewise removed by a chemical mechanical polishing in a further step.

After the polishing, there are via fillings 52, 54 in the cutouts 20 and 22. Fillings 56, 58 made of copper are situated in the cutouts 24 and 26. The fillings 52 to 58 completely fill the cutouts 20, 22, 24 and 26.

Although a single damascene method is explained with reference to FIGS. 1 to 5, the method steps explained can also be carried out in a dual damascene method. Copper interconnects and copper vias are produced simultaneously in a dual damascene method.

As illustrated in FIG. 3, after the polishing a resist layer 100 is applied, exposed and developed, cutouts 102 and 104 being produced in the resist layer 100, the bottom of said cutouts adjoining the opening of the cutout 24 and the opening of the cutout 26, respectively. After the development of the resist layer 100, the via fillings 52 and 54 are covered by the resist layer 100, while the fillings 56 and 58 are uncovered at the bottom of the cutout 102 and 104, respectively.

The alignment of the mask for the irradiation of the resist layer 100 is once again unproblematic because the resist layer 100 exhibits good optical transmission. By way of example, the fillings 56 and 58 can be used for alignment. A tolerance range T1 for the left-hand side area 106 of a resist region 108 lying between the cutouts 24 and 26 is more than 400 nm, for example, and is thus considerably greater than the tolerances that are otherwise customary for the alignment and for monitoring of the overlay measurements of 50 nm to 200 nm.

In an alternative configuration, no alignment is carried out during the exposure of the resist layer 100. This is possible if tolerances of 1 μm, for example, are permissible because the cutouts 24 and 26 are at such a distance away from other structures of the integrated circuit arrangement.

After the development of the resist layer 100, the fillings 56 and 58 are removed from the cutouts 24 and 26, so that only the liner layer 50 remains in the cutouts 24 and 26. As an alternative, however, the liner layer 50 is also concomitantly removed. In the exemplary embodiment, the fillings 56 and 58 are removed by one of the etching chemicals mentioned above. The residues of the resist layer 100 that remained on the insulating layer 16 are subsequently removed.

Figure 4:
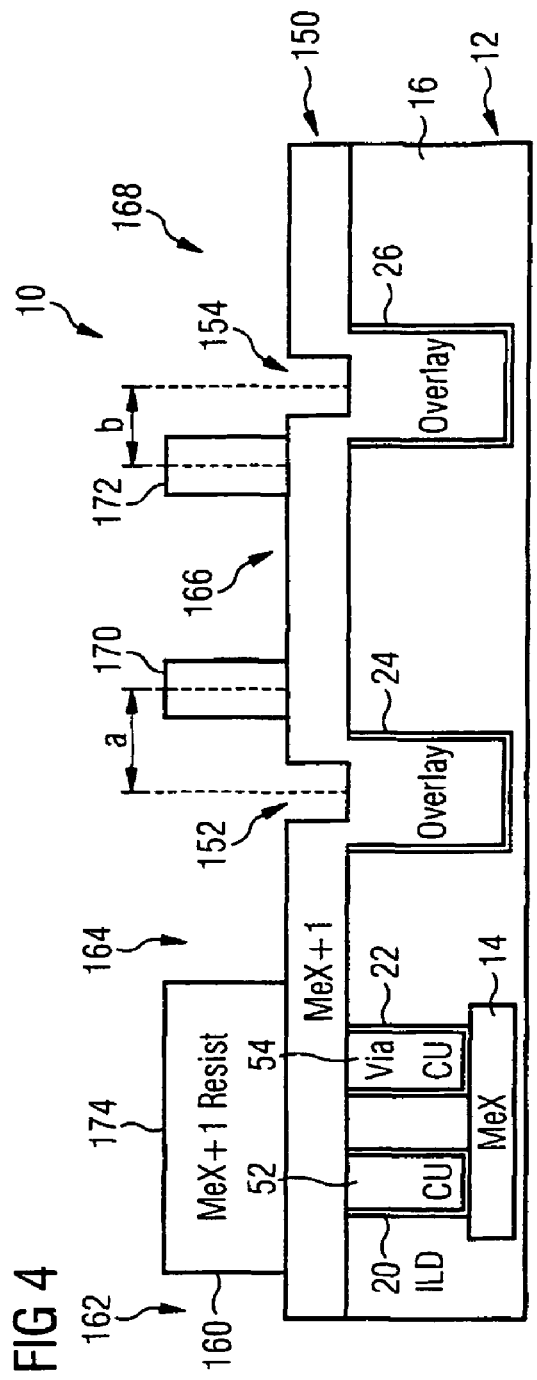
FIG. 4 is an example fourth production stage in the production of an integrated circuit arrangement.

As is further illustrated in FIG. 4, after the removal of the residues of the resist layer 100, a metal layer 150 is applied, e.g. by sputtering on an aluminum layer having a thickness of 3 μm or greater than 500 nm. The thickness of the metal layer 150 is coordinated with the width of the cutouts 24 and 26 in order to be able to make a sufficiently good topology available in the subsequent plane 150.

After the metal layer 150 has been applied by sputtering, a resist layer 160 is applied to the metal layer 150, irradiated and developed, cutouts 162, 164, 166 and 168 arising. The indentations 152 and 154 are used in the alignment of the mask used for the exposure of the resist layer 160. The alignment is tested after the development of the resist layer 160 with the aid of resist structures 170 and 172 situated between the cutouts 24 and 26, the resist structure 170 lying closer to the indentation 152 and the resist structure 172 lying closer to the indentation 154. An optical method is used to determine a distance a in the x direction between the center of the indentation 152 and the center of the resist structure 170. A distance b between the center of the indentation 154 and the center of the resist structure 172 is likewise determined. If the distances a and b that have been 15 determined are identical, then an ideal value for the overlay measurement is present. The same analogously holds true for the alignment in the y direction.

Deviations in the range of + and −50 nm are permitted per orientation, for example. If these tolerances are exceeded, then a new resist layer 160 must be applied. The developed resist layer 160 additionally contains a resist structure 174 situated above the cutouts 20 and 22.

Figure 5:
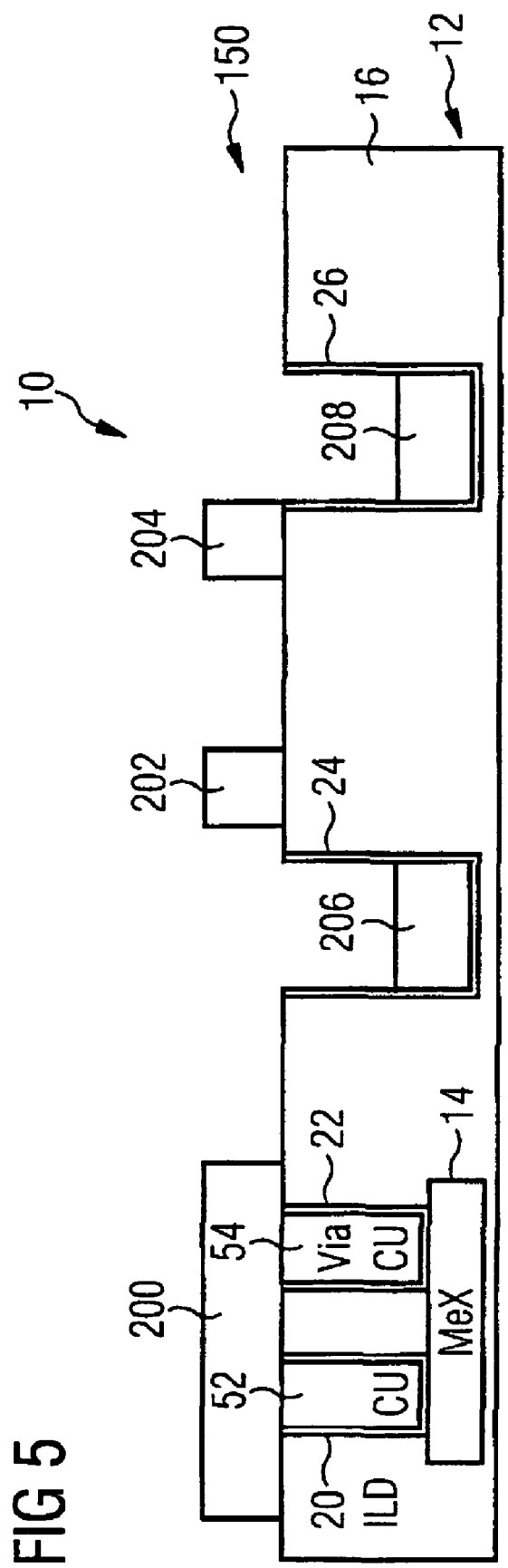
FIG. 5 is an example fifth production stage in the production of an integrated circuit arrangement.

After successful overlay measurement, the metal layer 150 is patterned e.g. wet-chemically or dry-chemically using the developed resist layer, as in FIG. 5. A multiplicity of interconnects, for example an interconnect 200 adjoining the via fillings 52 and 54, arise in the metal layer in the process. Metal structures 202, 204, 206, and 208, which do not influence the function of the developed circuit arrangement 10 arise beneath the resist structures 170, 172 and in the cutouts 24 and 26, respectively.

The production of the integrated circuit arrangement 10 is then continued, for example with the production of further insulating layers and metal layers or with the application of passivation layers if the metal layer 150 is the topmost or furthest away metal layer of the integrated circuit arrangement.

As has been explained with reference to FIGS. 1 to 5, an alignment error of a mask for the exposure of the resist layer 100 does not affect the total offset error of aluminum plane 150 with respect to copper plane because only already existing alignment marks 24, 26 that have already been produced in the contact hole plane or in the via plane are uncovered by this auxiliary mask. The uncovered topology generates indentations 152, 154 that are imaged on or over the metal layer 150.

The overall error is significantly reduced by the direct alignment of a mask for the patterning of an aluminum layer relative to marks 24, 26 that have been produced in the preceding contact hole plane. A method for direct alignment in the transition from copper to aluminum is thus specified. Apart from being applied to copper technologies relating to the transition to an aluminum plane, however, the method can also be applied to other metallization materials or to other conductive materials.

It is therefore intended that the foregoing detailed description be regarded as illustrative rather than limiting, and that it be understood that it is the following claims, including all equivalents, that are intended to define the spirit and scope of this invention.

The invention claimed is:

1. A method for producing an integrated circuit arrangement with an auxiliary indentation, the method comprising:
   producing at least one useful indentation and at least one auxiliary indentation in a substrate;
   applying a filling layer to the substrate provided with the at least one useful indentation and with the at least one auxiliary indentations;
   depositing filling material into the at least one useful indentation and into the at least one auxiliary indentation;
   planarizing the filling layer, with filling material remaining in the at least one useful indentation and filling material remaining in the at least one auxiliary indentation; and
   selectively removing at least a portion of the filling material in the at least one auxiliary indentation after planarization, with no filling material removed from the at least one useful indentation;
   applying a covering layer after the selective removal such that at least one secondary auxiliary indentation is produced in the covering layer above the at least one auxiliary indentation.

2. The method of claim 1, further comprising using the at least one auxiliary indentation or a topology arising on the at least one auxiliary indentation as an alignment mark during patterning of a layer.

3. The method of claim 1, wherein planarizing comprises chemical mechanical polishing and wherein the filling material comprises copper or a copper alloy with at least 50 atomic percent of copper.

4. The method of claim 1, wherein the substrate is a semiconductor substrate in which the at least one useful indentation and the at least one auxiliary indentation are arranged.

5. The method of claim 1, wherein the substrate comprises a semiconductor substrate and a dielectric layer, the at least one useful indentation and the at least one auxiliary indentation arranged in the dielectric layer.

6. The method of claim 1, further comprising:
applying a resist layer;
irradiating the resist layer; and
developing the resist layer, the at least one auxiliary indentation being uncovered and the at least one useful indentation remaining covered,
the applying, irradiating, developing carried out during the selective removal.

7. The method of claim 6, further comprising:
wet-chemical removing of filling material from the at least one auxiliary indentation;
using a dilute sulfuric acid peroxide (DSP) mixture or by a DSP chemical; and
aligning a mask and the resist layer prior to irradiation with a tolerance of greater than 200 nanometers.

8. The method of claim 1, further comprising completely removing the filling material from the at least one auxiliary indentation.

9. The method of claim 8, wherein completely removing the filling material comprises selectively removing with respect to a liner layer, the liner layer comprising tantalum nitride.

10. The method of claim 1, wherein
applying the covering layer after the selective removal comprises depositing a portion of the covering layer in the at least one auxiliary indentation, but not in the at least one useful indentation.

11. The method of claim 1, wherein applying the covering layer comprises applying a layer that is electrically conductive or is electrically semiconducting.

12. The method of claim 11, wherein the covering layer comprises silicon or a silicon alloy with at least 50 atomic percent of silicon.

13. The method of claim 1, further comprising:
patterning the covering layer by a photolithographic process; and
using the at least one secondary auxiliary indentation in the covering layer as an alignment mark.

14. The method of claim 13, wherein using the at least one secondary auxiliary indentation comprises using the alignment mark during radiation of a resist or when inspecting a position of developed resist.

15. The method of claim 1, wherein the covering layer comprises a metal.

16. The method of claim 15, wherein the metal comprises aluminum or an aluminum alloy with at least 50 atomic percent of aluminum.

17. The method of claim 16, wherein the covering layer further comprises silicon or a silicon alloy with at least 50 atomic percent of silicon.

18. The method of claim 1, further comprising:
applying a resist layer above the covering layer;
irradiating the resist layer; and
developing the resist layer to produce at least one cutout above the at least one secondary auxiliary indentation.

19. The method of claim 18, wherein the developed resist layer comprises a resist structure above the at least one useful indentation.

20. The method of claim 19, further comprising patterning the covering layer using the resist structure to produce an interconnect above the at least one useful indentation.

21. The method of claim 18, wherein the at least one auxiliary indentation comprises a first auxiliary indentation and a second auxiliary indentation, wherein the at least one secondary auxiliary indentation comprises a first secondary auxiliary indentation and a second secondary auxiliary indentation, and wherein applying the covering layer comprises producing the first secondary auxiliary indentation in the covering layer above the first auxiliary indentation and the second secondary auxiliary indentation in the covering layer above the second auxiliary indentation.

22. The method of claim 21, wherein developing the resist layer comprises producing:
a first cutout above the first secondary auxiliary indentation and a second cutout above the second secondary auxiliary indentation; and
a first resist structure and a second resist structure each between the first and second cutouts.

23. The method of claim 22, further comprising comparing a first distance comprising a distance between a center of the first secondary auxiliary indentation and a center of the first resist structure with a second distance comprising a distance between a center of the second secondary auxiliary indentation and a center of the second resist structure.

24. The method of claim 23, further comprising identifying whether a magnitude of a difference between the first distance and the second distance exceeds approximately 50 nanometers.

25. The method of claim 24, further comprising applying a new resist layer when the magnitude of the difference between the first and second distances exceeds approximately 50 nanometers.

26. The method of claim 24, further comprising patterning the covering layer to produce a first metal structure in a portion of the covering layer below the first resist structure when the magnitude of the difference between the first and second distances does not exceed approximately 50 nanometers.

27. The method of claim 22, further comprising patterning the covering layer to produce a first metal structure in a portion of the covering layer below the first resist structure and a second metal structure in a portion of the covering layer below the second resist structure.

* * * * *